(12) United States Patent
Jenkins

(10) Patent No.: US 7,821,301 B2
(45) Date of Patent: Oct. 26, 2010

(54) METHOD AND APPARATUS FOR MEASURING AND COMPENSATING FOR STATIC PHASE ERROR IN PHASE LOCKED LOOPS

(75) Inventor: Keith Aelwyn Jenkins, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/329,458

(22) Filed: Jan. 11, 2006

(65) Prior Publication Data

US 2007/0159213 A1    Jul. 12, 2007

(51) Int. Cl.
*H03D 13/00*    (2006.01)
(52) U.S. Cl. .................. 327/12; 327/3; 327/7
(58) Field of Classification Search .......... 327/1–3, 327/5, 7, 8, 12, 39–49, 149, 158, 161
See application file for complete search history.

(56) References Cited

U.S. PATENT DOCUMENTS

| | | | | |
|---|---|---|---|---|
| 5,118,975 A * | 6/1992 | Hillis et al. | ................. | 327/158 |
| 5,568,071 A * | 10/1996 | Hoshino et al. | ............... | 377/43 |
| 5,604,775 A * | 2/1997 | Saitoh et al. | ................ | 375/376 |
| 6,072,347 A * | 6/2000 | Sim | ........................... | 327/276 |
| 6,288,574 B1 * | 9/2001 | Neary | ......................... | 327/12 |
| 6,404,248 B1 * | 6/2002 | Yoneda | ....................... | 327/158 |
| 6,429,693 B1 * | 8/2002 | Staszewski et al. | ........... | 327/12 |
| 6,483,871 B1 * | 11/2002 | Dawe | ......................... | 375/226 |
| 6,646,484 B2 * | 11/2003 | Ito | ............................ | 327/158 |
| 6,838,912 B1 * | 1/2005 | Chou | ............................ | 327/3 |
| 7,009,433 B2 * | 3/2006 | Zhang et al. | ................ | 327/158 |
| 7,039,824 B2 * | 5/2006 | Simon et al. | ................ | 713/400 |
| 7,129,789 B2 * | 10/2006 | Hsiao et al. | ................. | 331/1 A |
| 7,276,946 B2 * | 10/2007 | Lin | ............................ | 327/158 |
| 7,471,131 B2 * | 12/2008 | Liu et al. | .................... | 327/158 |

* cited by examiner

*Primary Examiner*—Hai L Nguyen
(74) *Attorney, Agent, or Firm*—Tutunjian & Bitetto, P.C.; Anne V. Dougherty, Esq.

(57) ABSTRACT

A method and circuit for static phase error measurement includes a reference clock delay chain having a selectable number of delay elements. A number of the delay elements are enabled in accordance with a select length signal to delay a reference clock signal. A feedback signal delay chain also has a selectable number of delay elements. A number of the delay elements are enabled in accordance with a select length signal to delay a feedback signal. A latch tests phase alignment between the delayed reference clock signal and the delayed feedback signal and outputs a measurement of static phase error.

18 Claims, 7 Drawing Sheets

METHOD AND APPARATUS FOR MEASURING AND COMPENSATING FOR STATIC PHASE ERROR IN PHASE LOCKED LOOPS

BACKGROUND

1. Technical Field

The present invention relates to measurement and compensation circuits, and more particularly to methods and circuits, which measure and compensate for static phase error in phase locked loops.

2. Description of the Related Art

Phase locked loops (PLLs) are used in many integrated circuits to distribute and multiply clock signals while maintaining a constant phase (timing relationship) with respect to a reference clock. Basic blocks of PLLs are illustratively shown in FIG. 1A.

Referring to FIG. 1A, a phase locked loop (PLL) circuit 10 includes a phase and frequency detector (PFD) 12 at the input. At this point, (at PFD 12) a reference clock 14 and a feedback clock 16 generated by the PLL should have the same phase, that is, they should arrive at the same time. However, because of circuit design or process problems, it is possible that these signals may not be in phase, that is, that there is an average difference in timing at this point, which is known as a static phase error. The PFD 12 outputs a signal which indicates whether the reference clock and the feedback clock are out of phase. This output signal activates a charge pump 17 to generate a voltage on the capacitor 18 of the loop filter 20, which controls the frequency of the voltage controlled oscillator 24.

In particular, leakage through a capacitor 18 of a loop filter 20, which is an increasing problem in modern semiconductor processing technologies, can cause static phase error even though the rest of the PLL functions correctly. A voltage controlled oscillator (VCO) 24 outputs a clock signal 26. This clock signal is used for feedback through a frequency divider 28 to become the feedback clock 16, which is compared to the reference clock 16.

The result of static phase error is shown in FIG. 1B. Referring to FIG. 1B, the phase of the reference clock 14 and the average phase of the feedback clock 16 differ. The feedback clock 16 also has some jitter, as shown. A static phase error 30 corresponds to the mean value of the jittery feedback clock.

Static phase error must be kept below some minimum specified value. Excessive phase error will increase the jitter, and reduce the frequency operating range of the PLL. However, there is no easy way to measure it, and no way to correct it if it is out of range of the specification. At present, it can be measured only by bringing the signals off chip through high bandwidth driver input/output devices, connection via high bandwidth cables, and using an oscilloscope for the measurements.

SUMMARY

A method and circuit for static phase error measurement includes a reference clock delay chain having a selectable number of delay elements. A number of the delay elements are enabled in accordance with a select length signal to delay a reference clock signal. A feedback signal delay chain also has a selectable number of delay elements. A number of the delay elements are enabled in accordance with a select length signal to delay a feedback signal. A latch tests phase alignment between the delayed reference clock signal and the delayed feedback signal and outputs a measurement of static phase error.

A circuit for static phase error correction includes a reference clock delay chain having a selectable number of delay elements, a number of which are enabled in accordance with a select length signal to delay a reference clock signal. A feedback signal delay chain having a selectable number of delay elements, a number of which are enabled in accordance with a select length signal to delay a feedback signal. A phase and/or frequency detector compares the delayed reference clock signal and the delayed feedback clock signal to determine phase differences therebetween. A latch tests for phase alignment between the delayed reference clock signal and the delayed feedback signal to determine a measurement of and correct a static phase error by adjusting the select length signals to enable delay elements.

A method for measuring static phase error includes providing a reference clock delay chain having a selectable number of delay elements, a number of which can be enabled to delay a reference clock signal, providing a feedback signal delay chain having a selectable number of delay elements, a number of which can be enabled in accordance to delay a feedback signal, and testing phase alignment between the delayed reference clock signal and the delayed feedback signal. If a difference between the delayed reference clock signal and the delayed feedback signal exits, the number of delay elements is adjusted until the difference is determined.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
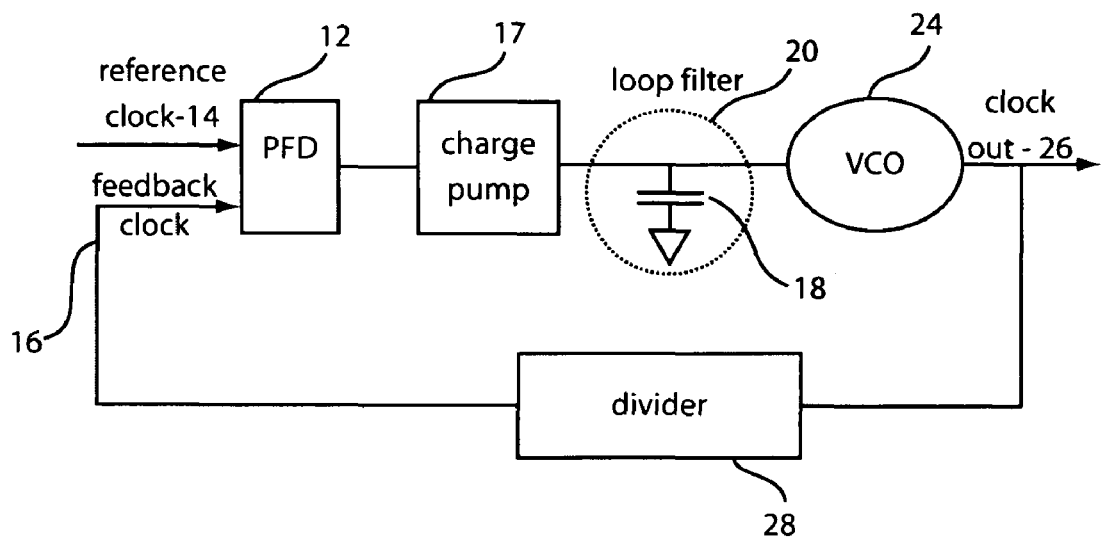
FIG. 1A is a schematic diagram showing a prior art phase locked loop circuit.

The present invention provides circuits which are built along with a phase locked loop (PLL) in integrated circuits or connected with PLLs in wired circuits. The circuits provide a measurement of static phase error. The present invention further makes it possible to adjust the phases of reference and feedback signals if the phase error is too large. The present invention relies on adjustable delay chains providing input to a latch which tests for phase alignment. The measurement circuit is preferably entirely self-contained. For example, the measurement circuit needs no external controls or off-chip measurements. Thus, every chip manufactured can be tested without special equipment or setup. The measurement and its results are controlled entirely through digital input/output signals. The present invention also provides correction circuits for correcting static phase errors.

Embodiments of the present invention can take the form of an entirely hardware embodiment, an entirely software embodiment or an embodiment including both hardware and software elements. In a preferred embodiment, the present invention is implemented as a wired circuit, an integrated circuit or within an integrated circuit chip, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The circuits as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may be converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. The methods described herein may be performed by or on integrated circuit chips.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
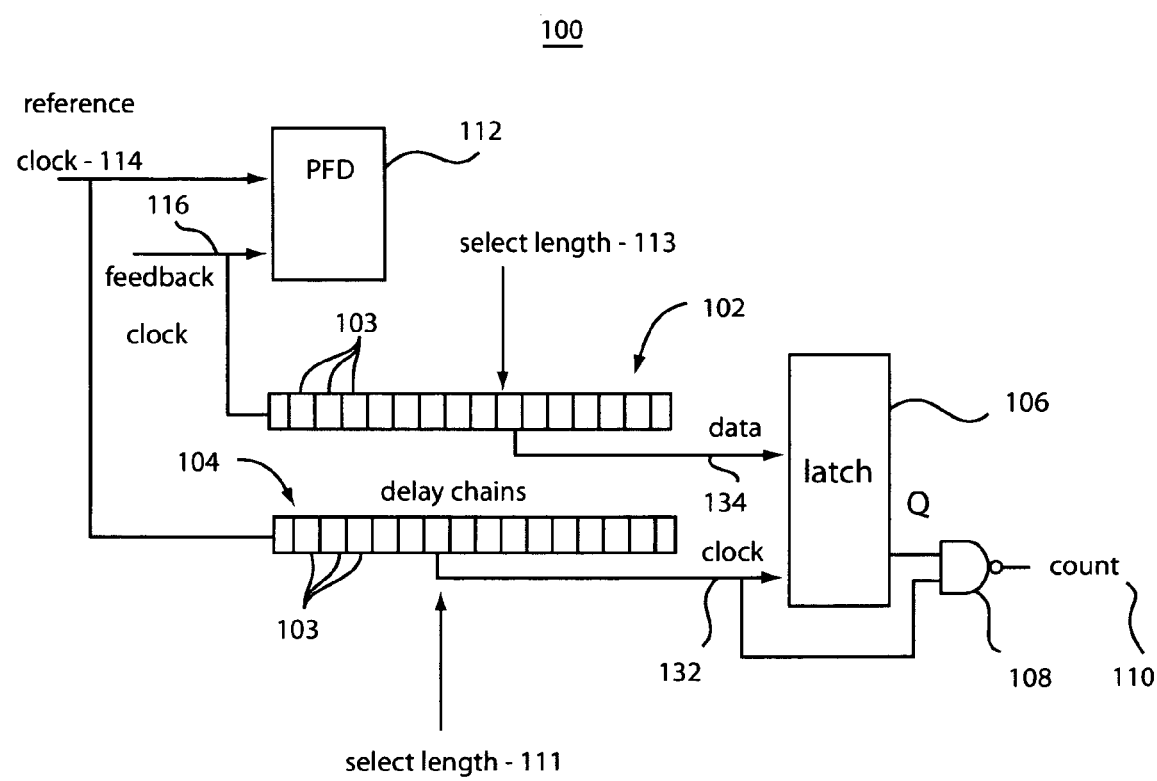
FIG. 2 is a schematic diagram showing one embodiment of a static phase error measurement circuit in accordance with an illustrative embodiment.

Referring now to the drawings in which like numerals represent the same or similar elements and initially to FIG. 2, a circuit 100 for measuring static phase error is illustratively shown in accordance with one exemplary embodiment. A static phase error is measured by applying a reference clock 114 and a feedback signal 116 to delay chains 104 and 102 as will be described in further detail below.

At a selected number of delay elements 103 as determined by a selected length signal 111 and/or selected length signal 113, the delayed output signals are applied to a latch 106. The selection (selection length or number of delay elements used in the chain of delay elements) can be performed in a plurality of ways. In one example, a multiplexer is employed to select a number of delay elements 103 to be enabled or disabled. In another example, transistors, switches or logic gates may be employed to enable a set of delay elements 103. The number of delay elements can be increased or decreased as needed and in accordance with a comparison result which influences the select length signals 111, 113.

The reference clock signal 114 is applied to a clock input 132 of the latch 106, and the feedback signal 116 is applied to a data input 134 of the latch 106. In one example, if the reference clock 114 arrives at an earlier time than the feedback signal 116, then the output Q of the latch 106 has a logical 'zero' value. If the feedback signal 116 arrives before the reference clock 114, the output Q of the latch 106 has a logical 'one' value. The delay chain lengths 111 and 113 are selectively incremented by digital control until the latch output Q is observed to make a transition from a logical zero to a logical one.

This represents the delay necessary to have the two signals in phase, that is, zero static phase error. By determining the amount of delay needed to observe this zero phase error, the original phase error is known. The delay is established by the number of delay elements 103 selected, and the value per element 103 can be established in a simple calibration. It is to be understood that other digitally controlled delays can be designed without changing the basic concepts of the present invention.

Figure 1B:
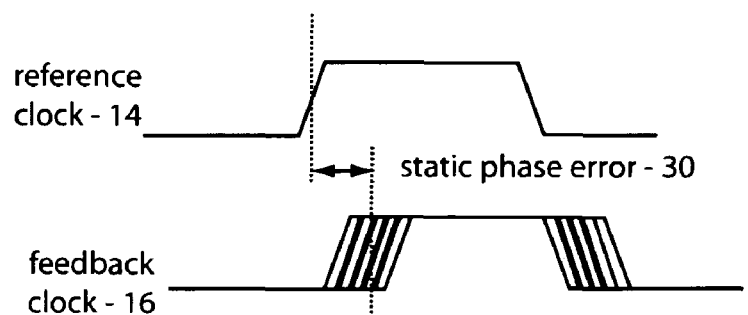
FIG. 1B is a signal/timing diagram showing static phase error between a reference clock and a feedback clock in accordance with the prior art.

Since the feedback signal will have timing jitter with respect to the reference, (See, e.g. FIG. 1B) additional circuitry may be needed to measure the average phase error, not the most extreme value resulting from jitter.

In one embodiment, additional circuitry includes a NAND gate 108 at the output of the latch 106. This gate 108, or its equivalent results in a 'count' signal 110 going to a logical zero for each reference clock 114. Hence, the toggling rate of 'count' signal 110 depends on phase error. When reference clock delay 113 is equal to the average feedback delay 111, the 'count' rate will be about one half of the reference clock rate, e.g., half of the feedback signals 116 will arrive before the reference clock 114, and half will arrive after. This half-rate can be measured by digital or analog means, according to two different circuits.

Figure 3:
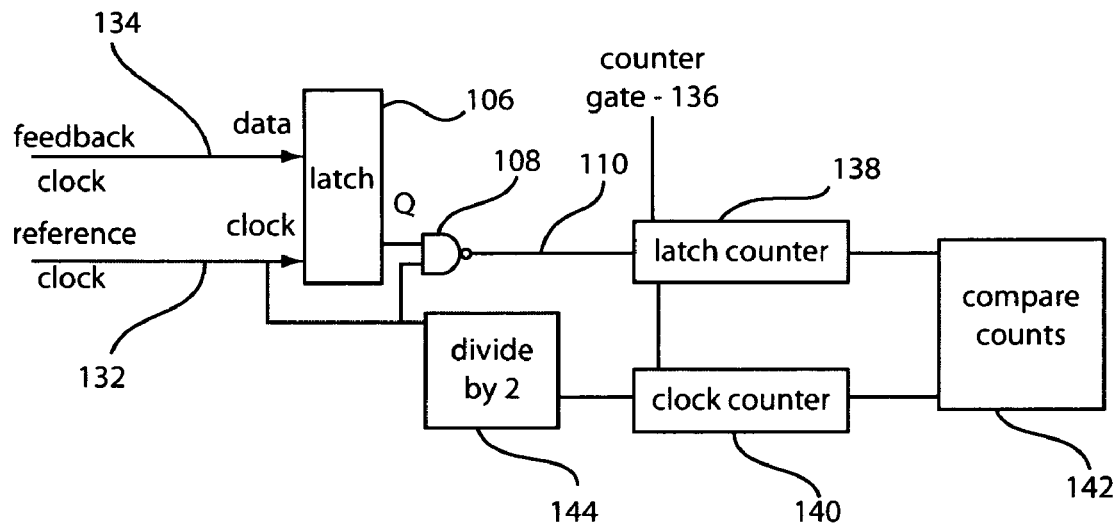
FIG. 3 is a schematic diagram showing a latch and clock counter to determine the static phase error for a digital measurement circuit in accordance with an illustrative embodiment.
Figure 5:
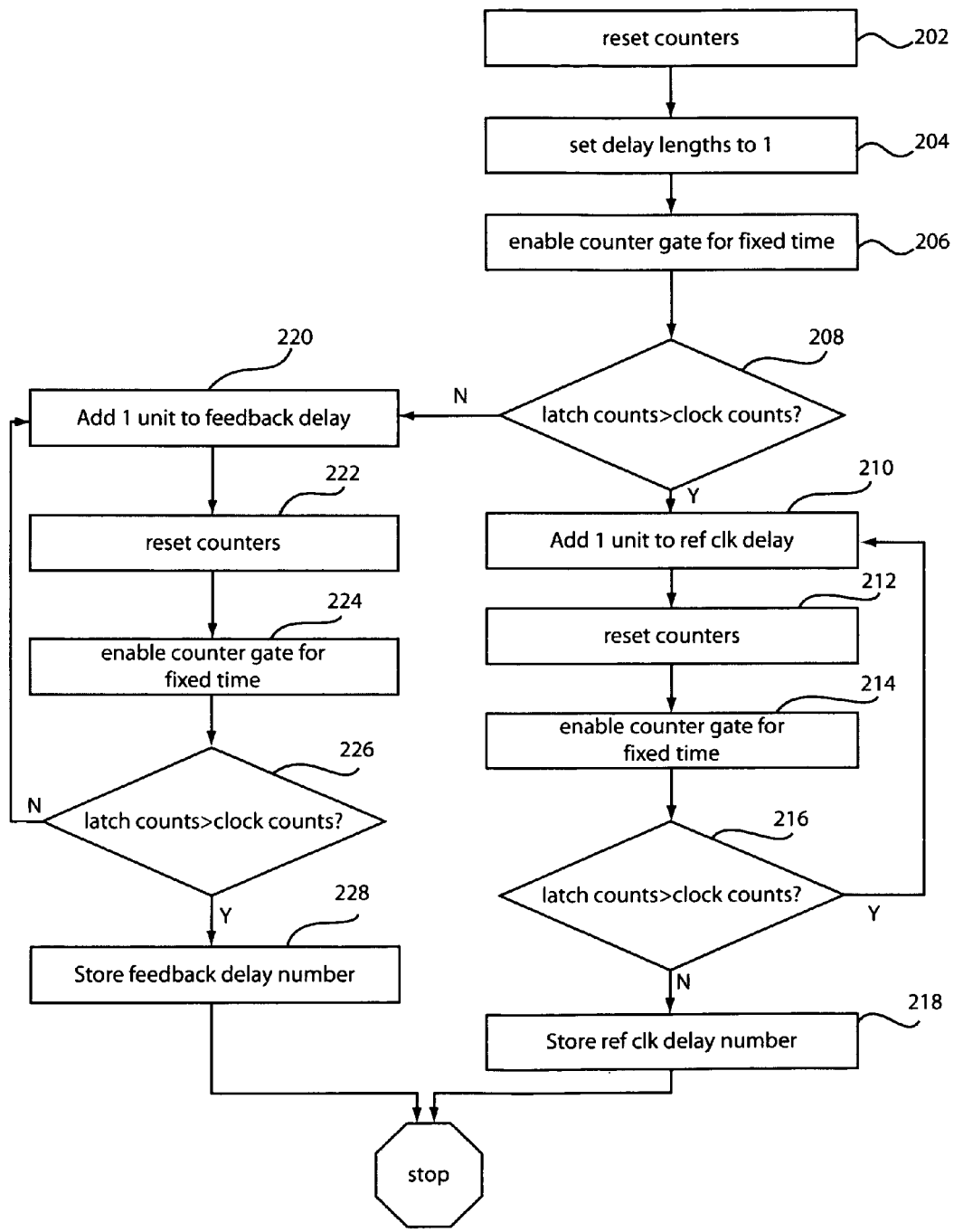
FIG. 5 is a block/flow diagram showing a system/method for measuring static phase error in accordance with the circuit of FIG. 3.

An exemplary digital circuit is illustrated in FIG. 3, and the corresponding method is illustrated in FIG. 5 and described in detail below.

Referring to FIG. 3, the reference clock frequency 132 at the "clock" input of the latch 106 is divided by two by a divider 144 (e.g., a binary register which truncates the least significant digit), and the resulting pulses are counted by an on-chip counter (clock counter) 140. A latch 'count' signal 110 is counted by another counter (latch counter) 138, as gated by a gate counter signal 136. The counter gate 136 may be controlled to enable the measurement circuit of FIG. 3, as needed.

When the two counters 138 and 140 have the same value when compared by a compare counts module 142, then the delay has been set to make the average (static) phase difference zero.

Figure 4:
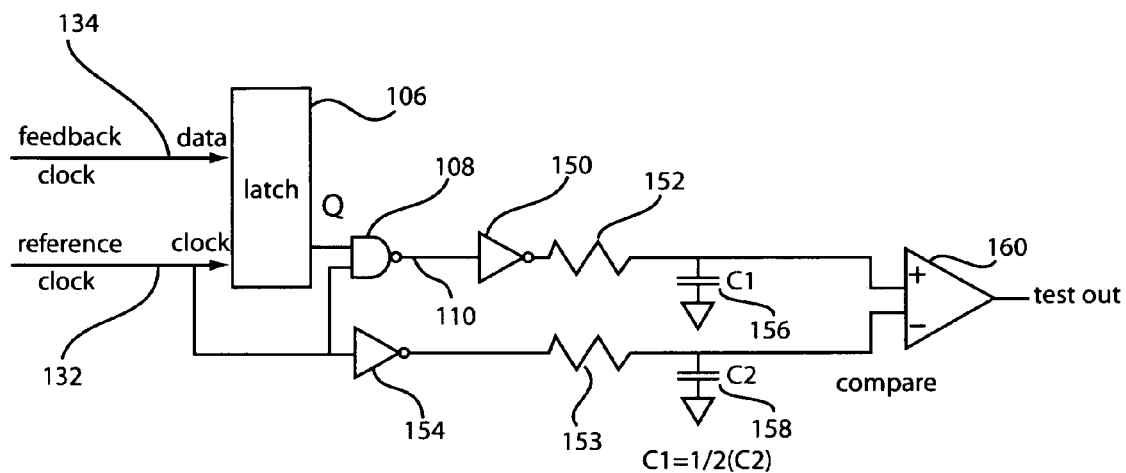
FIG. 4 is a schematic diagram showing an analog measurement circuit to determine the static phase error in accordance with an illustrative embodiment.
Figure 6:
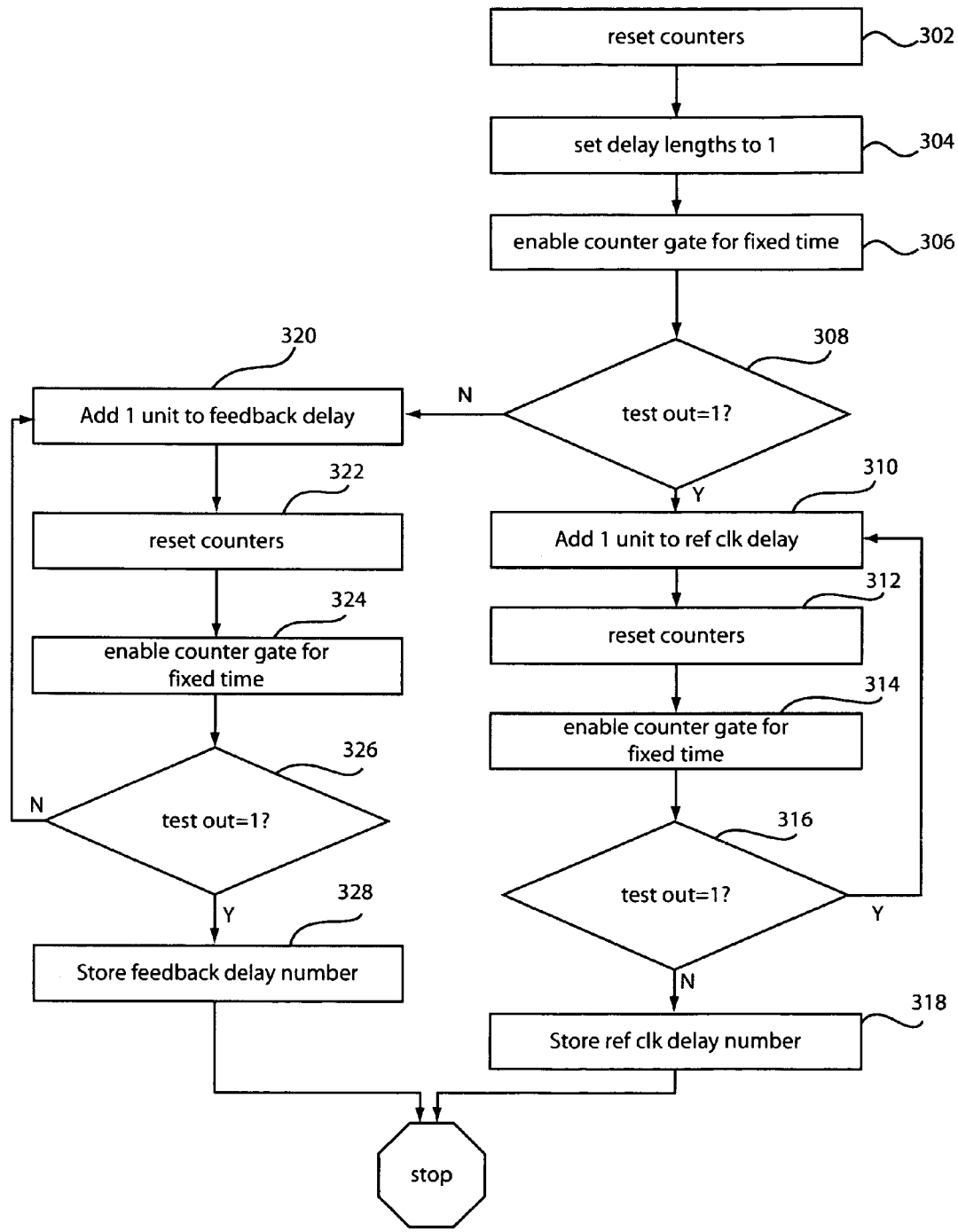
FIG. 6 is a block/flow diagram showing a system/method for measuring static phase error in accordance with the circuit of FIG. 4.

An exemplary analog circuit is indicated in FIG. 4, and the corresponding method is shown in FIG. 6.

Referring to FIG. 4, a count signal 110 is applied to an inverter 150 and to a capacitor 156 (C1), which has a resistor 152 in series to act as a filter. The voltage on the capacitor 156 is proportional to the duty cycle of the count signal 110. The delayed reference clock 132 is applied similarly through inverter 154 to capacitor 158 (C2), which has a resistor 153 in series to act as a filter. Capacitor 158 has a capacitance C2 of twice the value of C1. Thus, when the voltage of C1 equals the voltage of C2, the average rate of pulses from the latch 106 is ½ the number of pulses of the reference clock, which is the desired condition for zero average static phase error. This condition is tested by a comparator 160, which changes an output state, test out, from 0 to 1 when the voltage on C1 exceeds the voltage on C2. The latch rate should be one half of the clock rate in both cases (FIGS. 3 and 4).

By either method of detecting, the measurement process is essentially the same, as shown in FIGS. 5 and 6.

Referring to FIG. 5, for the digital case, in block 202 all counters are reset. In block 204, the delay chains are selected to minimum length, e.g., delay length of 1. In block 206, the counter gate is enabled for a fixed amount of time to take a measurement. In block 208, the rate of latched 'ones' is compared to the rate of the clock. If the rate of latch counts is higher than one half, then the delay of the reference clock is incremented in block 210, and the test performed again by resetting counters in block 212, enabling the counter gate in block 214 and comparing the latch counts to the clock counts in block 216. If the rate is still higher than one half, then the reference clock is incremented again in block 210, as so on until the latch rate drops below one half of the clock rate.

At this point, the static phase error has been determined to be the negative of the number of delay increments times the delay per increment, which can be obtained by design or calibration. This value is stored in block 218.

If, on the other hand, upon the first test, the rate is less than one half, then the delay of the feedback clock is incremented in block 220, and the test is performed again by resetting counters in block 222, enabling the counter gate in block 224 and comparing the latch counts to the clock counts in block 226.

If the rate is still less then one half, then the feedback clock delay is incremented again in block 220, and so on until the latch rate exceeds one half of the clock rate. At this point the static phase error has been determined to be the number of delay increments times the delay per increment. This value is stored in block 228.

Referring to FIG. 6, for the analog case, in block 302 all counters are reset. In block 304, the delay chains are selected to minimum length, e.g., delay length of 1. In block 306, the counter gate is enabled for a fixed amount of time to take a measurement. In block 308, if test out is equal to one, then the delay of the reference clock is incremented in block 310. The test is performed again by resetting counters in block 312, enabling the counter gate in block 314 and determining if test out equals 1. If test out is still one, then the reference clock is incremented again in block 310, and so on until test out switches to zero.

At this point, the static phase error has been determined to be the negative of the number of delay increments times the delay per increment, which can be obtained by design or calibration. This value is stored in block 318.

If, on the other hand, upon the first test (308), test is not one, then the delay of the feedback clock is incremented in block 320, and the test is performed again by resetting counters in block 322, enabling the counter gate in block 324 and testing test out again in block 326.

If test out is still less one, then the feedback clock delay is incremented again in block 320, and so on until test out switches. At this point the static phase error has been determined to be the number of delay increments times the delay per increment. This value is stored in block 328.

Additionally, this method of measuring static phase error can be used to compensate for a condition, such as out of phase or frequency mismatches. In this case, the delay elements 103 may be inserted directly in the path of the reference clock 114 and feedback signals 116, as shown in FIG. 7.

Figure 7:
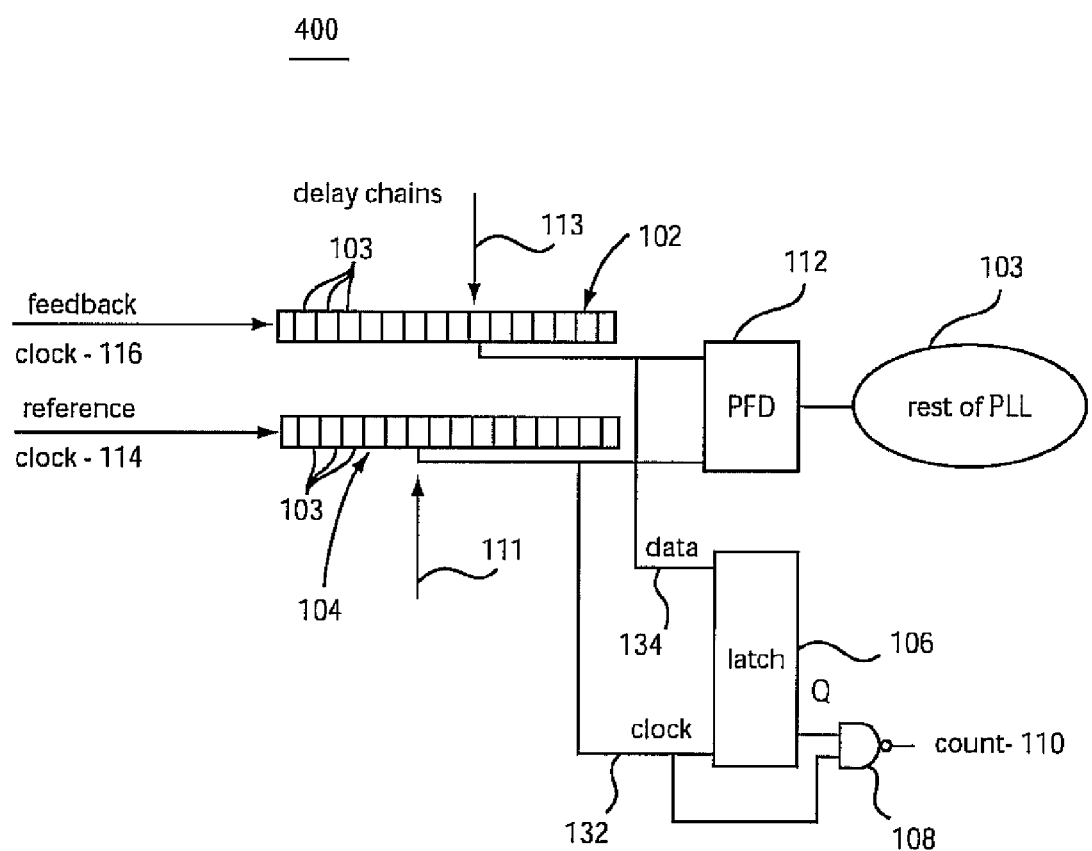
FIG. 7 is a schematic diagram showing delay chains inline with a reference clock and a feedback clock to provide for static phase error correction in accordance with an illustrative embodiment.

Referring to FIG. 7, an alternate measurement circuit 400 is shown in accordance with an alternate embodiment. The reference clock 114 and feedback signal 116 are input to PFD 112. At a position prior to reaching the PFD 112, delay chains 102 and 104 may be inserted into the signal paths. This may be employed to handle a specific circuit condition, for example, if a first condition occurs the feedback clock path is incremented or decremented, and if a different condition occurs the reference clock is incremented or decremented. Both signal paths may be altered simultaneously.

In one embodiment, a lookup table or other memory storage device may include chain lengths 111 and 113 which have values corresponding to a plurality of different conditions. When the conditions are determined an appropriate delay length value is provided.

The remaining elements of the measurement circuit 400 are similar or the same to those described above. By measurement circuit 400 having delay elements 103 in the signal path prior to reaching the latch 106 and/or the PFD 112, the static phase error can be measured, and the delay elements can be left at the selected values which set the phase error to zero. It is noted that this setting of delays may be done occasionally, such as at start-up of the PLL 103, or a change in operating voltage or temperature, and need not be a dynamically changing adjustment.

It is to be understood that portions of the circuits disclosed herein may be combined to achieve preferred functionality. For example, the embodiments shown in FIGS. 2, 3 and 4 may be combined with the structure of FIG. 7, to provide circuits, analog or digital which measure and compensate for static phase error.

Having described preferred embodiments of a method and apparatus for measuring and compensating for static phase error in phase locked loops (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A circuit for static phase error measurement, comprising:
    a reference clock delay chain having a selectable number of delay elements, a number of which are enabled in accordance with a select length signal to delay a reference clock signal;
    a feedback signal delay chain having a selectable number of delay elements, a number of which are enabled in accordance with a select length signal to delay a feedback signal; and
    a latch which tests for phase alignment between the delayed reference clock signal and the delayed feedback signal and outputs a measurement of static phase error,
    a digital control configured to output the select length signals to adjust the selectable number of delay elements in accordance with the measurement.

2. The circuit as recited in claim 1, wherein the reference clock and the feedback signal are coupled to the delay chains and the delayed reference clock and the delayed feedback signal are coupled to a detector for a phase locked loop.

3. The circuit as recited in claim 1, further comprising a NAND gate which outputs a count and takes as input the output from the latch and the delayed reference signal.

4. The circuit as recited in claim 3, further comprising:
    a latch counter which counts the count output of the NAND gate;
    a clock counter which counts a clock input to the latch; and
    a compare module which determines a difference between accumulated counts of the latch counter and the clock counter to determine average static phase differences.

5. The circuit as recited in claim 4, further comprising a divide-by-two divider which divides the clock input to the latch to permit comparison between the latch and clock counters.

6. The circuit as recited in claim 3, wherein the output of the NAND gate is coupled to a first filter and the delayed feedback signal is coupled to a second filter having a capacitance twice as great as the first filter, and further comprising a comparator which compares output signals from the first and second filters to provide the measurement.

7. The circuit as recited in claim 1, wherein the reference clock and the feedback signal are coupled to the delay chains and a detector for a phase locked loop.

8. A circuit for static phase error correction, comprising:
    a reference clock delay chain having a selectable number of delay elements, a number of which are enabled in accordance with a select length signal to delay a reference clock signal;
    a feedback signal delay chain having a selectable number of delay elements, a number of which are enabled in accordance with a select length signal to delay a feedback signal;
    a phase and/or frequency detector which compares the delayed reference clock signal and the delayed feedback clock signal to determine phase differences therebetween; and
    a latch which tests for phase alignment between the delayed reference clock signal and the delayed feedback signal to determine a measurement of a static phase error which is employed as feedback for adjusting the select length signals to enable delay elements,
    a digital control configured to output the select length signals in accordance with the measurement which is a function of the output from the latch.

9. The circuit as recited in claim 8, further comprising a NAND gate which outputs a count and takes as input the output from the latch and the delayed reference signal.

10. The circuit as recited in claim 9, further comprising:
    a latch counter which counts the count output from the NAND gate;
    a clock counter which counts a clock input to the latch; and
    a compare module which determines a difference between accumulated counts of the latch counter and the clock counter to determine average static phase differences.

11. The circuit as recited in claim 10, further comprising a divide-by-two divider which divides the clock input to the latch to permit comparison between the latch and clock counters.

12. The circuit as recited in claim 9, wherein the output of the NAND gate is coupled to a first filter and the delayed feedback signal is coupled to a second filter having a capacitance twice as great as the first filter, and further comprising a comparator which compares output signals from the first and second filters to provide the measurement.

13. A method for measuring static phase error, comprising the steps of:
    providing a reference clock delay chain having a selectable number of delay elements, a number of which can be enabled to delay a reference clock signal;
    providing a feedback signal delay chain having a selectable number of delay elements, a number of which can be enabled in accordance to delay a feedback signal;
    testing phase alignment between the delayed reference clock signal and the delayed feedback signal; and
    if a difference between the delayed reference clock signal and the delayed feedback signal exists, adjusting the number of delay elements until the difference is determined.

14. The method as recited in claim 13, wherein the step of adjusting the number of delay elements until the difference is determined includes incrementing or decrementing the number of delay elements until the difference is zero.

15. The method as recited in claim 14, further comprising the step of storing a delay number as a measure of static phase error when the difference is zero.

16. The method as recited in claim 13, further comprising the step of coupling the reference clock and the feedback signal to the delay chains and a detector for a phase locked loop.

17. The method as recited in claim 13, further comprising the step of coupling the reference clock and the feedback signal to the delay chains and coupling the delayed reference clock and the delayed feedback signal to a detector for a phase locked loop.

18. A computer program product comprising a computer useable medium including a computer readable program, wherein the computer readable program when executed on a computer causes the computer to perform the steps as recited in claim 13.

* * * * *